United States Patent
Yang et al.

(10) Patent No.: US 11,404,358 B2
(45) Date of Patent: Aug. 2, 2022

(54) SEMICONDUCTOR PACKAGE DEVICE AND METHOD OF MANUFACTURING THE SAME

(71) Applicant: Advanced Semiconductor Engineering Korea, Inc., Paju-Si (KR)

(72) Inventors: Junyoung Yang, Paju-Si (KR); Sangbae Park, Paju-Si (KR)

(73) Assignee: ADVANCED SEMICONDUCTOR ENGINEERING KOREA, INC., Paju-si (KR)

( * ) Notice: Subject to any disclaimer, the term of this patent is extended or adjusted under 35 U.S.C. 154(b) by 0 days.

(21) Appl. No.: 16/878,479

(22) Filed: May 19, 2020

(65) Prior Publication Data

US 2020/0279796 A1 Sep. 3, 2020

Related U.S. Application Data

(63) Continuation of application No. 15/663,639, filed on Jul. 28, 2017, now Pat. No. 10,679,929.

(51) Int. Cl.
*H01L 23/495* (2006.01)
*H01L 23/31* (2006.01)
(Continued)

(52) U.S. Cl.
CPC .... *H01L 23/49568* (2013.01); *H01L 21/4825* (2013.01); *H01L 21/4882* (2013.01);
(Continued)

(58) Field of Classification Search
CPC ......... H01L 23/49568; H01L 23/49524; H01L 23/4334; H01L 21/561; H01L 23/49555;
(Continued)

(56) References Cited

U.S. PATENT DOCUMENTS 5,309,021 A * 5/1994 Shimamoto ............ H05K 3/341
257/691
5,315,153 A 5/1994 Nagai et al.
(Continued)

OTHER PUBLICATIONS

Final Office Action for U.S. Appl. No. 15/663,639, dated Feb. 21, 2019, 12 pages.
(Continued)

*Primary Examiner* — Samuel Park
(74) *Attorney, Agent, or Firm* — Foley & Lardner LLP

(57) ABSTRACT

A semiconductor package device includes a leadframe, a first die and a package body. The leadframe includes a first die paddle and a lead. The first die paddle has a first surface and a second surface opposite to the first surface. The first die is disposed on the first surface of the first die paddle. The package body covers the first die and at least a portion of the first surface of the first die paddle and exposing the lead. The package body has a first surface and a second surface opposite to the first surface. The second surface of the package body is substantially coplanar with the second surface of the first die paddle. The lead extends from the second surface of the package body toward the first surface of the package body. A length of the lead is greater than a thickness of the package body.

14 Claims, 10 Drawing Sheets

(51) Int. Cl.
*H01L 23/552* (2006.01)
*H01L 21/48* (2006.01)
*H01L 21/56* (2006.01)
*H01L 21/78* (2006.01)
*H01L 23/433* (2006.01)

(52) U.S. Cl.
CPC .......... *H01L 21/561* (2013.01); *H01L 21/565* (2013.01); *H01L 21/78* (2013.01); *H01L 23/3114* (2013.01); *H01L 23/4334* (2013.01); *H01L 23/4952* (2013.01); *H01L 23/49524* (2013.01); *H01L 23/49548* (2013.01); *H01L 23/49555* (2013.01); *H01L 23/49562* (2013.01); *H01L 23/49575* (2013.01); *H01L 23/552* (2013.01); *H01L 23/3107* (2013.01); *H01L 23/49513* (2013.01); *H01L 2224/48091* (2013.01); *H01L 2224/48247* (2013.01); *H01L 2224/48257* (2013.01); *H01L 2224/4903* (2013.01); *H01L 2224/73265* (2013.01)

(58) Field of Classification Search
CPC ........... H01L 23/4952; H01L 23/49548; H01L 23/49562; H01L 23/49575; H01L 23/3114; H01L 23/552; H01L 21/4825; H01L 21/4882; H01L 21/565; H01L 21/78; H01L 2224/48257; H01L 2224/4903; H01L 2224/73265; H01L 2224/48091; H01L 23/3107; H01L 2224/48247; H01L 23/49513; H01L 24/85; H01L 2224/83801; H01L 24/84; H01L 24/83; H01L 2224/33181; H01L 24/33; H01L 24/92; H01L 24/97; H01L 24/95; H01L 2224/371; H01L 2224/40095; H01L 24/37; H01L 2224/73263; H01L 24/40; H01L 24/45; H01L 2924/181; H01L 2224/29101; H01L 24/29; H01L 2224/4911; H01L 24/32; H01L 24/73; H01L 2224/45015; H01L 2224/45124; H01L 2224/97; H01L 2224/40137; H01L 2224/40247; H01L 2224/73221; H01L 2924/3025; H01L 2224/32245; H01L 24/49; H01L 25/072; H01L 25/18; H01L 2224/832; H01L 2224/852; H01L 21/4821; H01L 23/495; H01L 23/49; H01L 23/52; H01L 2225/1029; H01L 24/01; H01L 2223/54486; H01L 2924/15; H01L 2924/18301; H01L 2221/68331; H01L 2224/01; H01L 2924/151; H01L 2924/1531; H01L 2924/19103; H01L 292/19105; H01L 2924/19106; H01L 21/48; H01L 23/00; H01L 41/29; H01L 21/568
See application file for complete search history.

(56) References Cited

U.S. PATENT DOCUMENTS

| | | | |
|---|---|---|---|
| 5,753,971 A | 5/1998 | Miller et al. | |
| 5,825,085 A * | 10/1998 | Masumoto | H01L 25/072 257/723 |
| 6,730,544 B1 * | 5/2004 | Yang | H01L 25/105 438/110 |
| 6,774,466 B1 | 8/2004 | Kajiwara et al. | |
| 7,205,180 B1 * | 4/2007 | Sirinorakul | H01L 24/49 438/123 |
| 7,960,818 B1 * | 6/2011 | Davis | H01L 23/49548 257/675 |
| 8,283,758 B2 | 10/2012 | Jiang | |
| 9,252,028 B2 | 2/2016 | Shiramizu et al. | |
| 9,627,302 B2 | 4/2017 | Ichikawa et al. | |
| 2002/0100963 A1 * | 8/2002 | Suzuki | H01L 25/105 257/678 |
| 2003/0127711 A1 * | 7/2003 | Kawai | H01L 21/565 257/666 |
| 2004/0222503 A1 * | 11/2004 | Lee | H01L 23/49575 257/678 |
| 2006/0151858 A1 * | 7/2006 | Ahn | H01L 23/49548 257/666 |
| 2007/0108568 A1 * | 5/2007 | Shim | H01L 23/49555 257/676 |
| 2008/0017882 A1 | 1/2008 | Nakanishi et al. | |
| 2008/0073759 A1 * | 3/2008 | Youn | H01L 23/49551 257/666 |
| 2009/0102031 A1 | 4/2009 | Almagro et al. | |
| 2009/0115048 A1 | 5/2009 | Zhao et al. | |
| 2010/0052190 A1 * | 3/2010 | Furukawa | H01L 23/3135 257/E23.116 |
| 2010/0244210 A1 * | 9/2010 | Fukushima | H01L 23/49548 257/670 |
| 2011/0285009 A1 * | 11/2011 | Chi | H01L 25/105 257/693 |
| 2011/0316133 A1 | 12/2011 | Do et al. | |
| 2013/0105957 A1 * | 5/2013 | Watanabe | H01L 21/561 257/E23.032 |
| 2013/0228930 A1 * | 9/2013 | Ono | H01L 23/49866 257/762 |
| 2013/0334677 A1 * | 12/2013 | Otremba | H01L 24/49 257/706 |
| 2014/0091446 A1 * | 4/2014 | Xue | H01L 23/49579 257/675 |
| 2014/0126160 A1 * | 5/2014 | Sugiyama | H01L 24/97 361/746 |
| 2014/0225661 A1 | 8/2014 | Otremba | |
| 2019/0148251 A1 | 5/2019 | Okabe et al. | |

OTHER PUBLICATIONS

Non-Final Office Action for U.S. Appl. No. 15/663,639, dated Sep. 20, 2018, 14 pages.
Notice of Allowance for U.S. Appl. No. 15/663,639, dated Feb. 6, 2020, 9 pages.

* cited by examiner

SEMICONDUCTOR PACKAGE DEVICE AND METHOD OF MANUFACTURING THE SAME

CROSS-REFERENCE TO RELATED APPLICATIONS

This application is a continuation of U.S. patent application Ser. No. 15/663,639 filed Jul. 28, 2017, the contents of which is incorporated herein by reference in its entirety.

BACKGROUND

1. Technical Field

The present disclosure relates to a semiconductor package device and a method of making the same, and to a semiconductor package device including a power die and a manufacturing method thereof.

2. Description of the Related Art

In a comparative method of packaging a power die (such as a power metal-oxide-semiconductor field-effect transistor (MOSFET) or an insulated gate bipolar transistor (IGBT)), the power die is mounted on a thick leadframe, electrically connected to leads of the leadframe by a thick wire and then a molding compound is formed to encapsulate the die and the leadframe. However, the manufacturing cost of such a process can be high. In addition, due to a high current generated by the power die, heat dissipation for the power die can be a problematic issue. Since the power die is encapsulated by the molding compound, the power die may have poor thermal performance, which can decrease a power efficiency of the power die.

SUMMARY

In some embodiments, according to one aspect, a semiconductor package device includes a leadframe, a first die and a package body. The leadframe includes a first die paddle and a lead. The first die paddle has a first surface and a second surface opposite to the first surface. The first die is disposed on the first surface of the first die paddle. The package body covers the first die and at least a portion of the first surface of the first die paddle and exposes the lead. The package body has a first surface and a second surface opposite to the first surface. The second surface of the package body is substantially coplanar with the second surface of the first die paddle. The lead extends from the second surface of the package body toward the first surface of the package body. A length of the lead is greater than a thickness of the package body.

In some embodiments, according to another aspect, a power module includes a carrier and a semiconductor package device. The semiconductor package device includes a leadframe, a die and a package body. The leadframe includes a first die paddle and a lead. The first die paddle has a first surface facing toward the carrier and a second surface opposite to the first surface. The die is disposed on the first surface of the first die paddle. The package body covers the die and at least a portion of the first surface of the first die paddle and exposes the lead. The package body has a first surface facing toward the carrier and a second surface opposite to the first surface. The second surface of the package body is substantially aligned with the second surface of the first die paddle. The lead extends from the second surface of the package body toward the carrier to connect to the carrier. The first surface of the package body is spaced apart from the carrier.

In some embodiments, according to another aspect, a method of manufacturing a semiconductor package device includes providing a conductive clip strip including at least a contact portion, and attaching a first surface of a die to the contact portion. The method further includes attaching a second surface of the die to a leadframe strip, applying a molding compound on the leadframe strip to cover the die and the conductive clip strip, and cutting through the conductive clip strip, the molding compound and the leadframe strip to form the semiconductor package device including the conductive clip, a portion of the molding compound and the leadframe.

Figure 1:
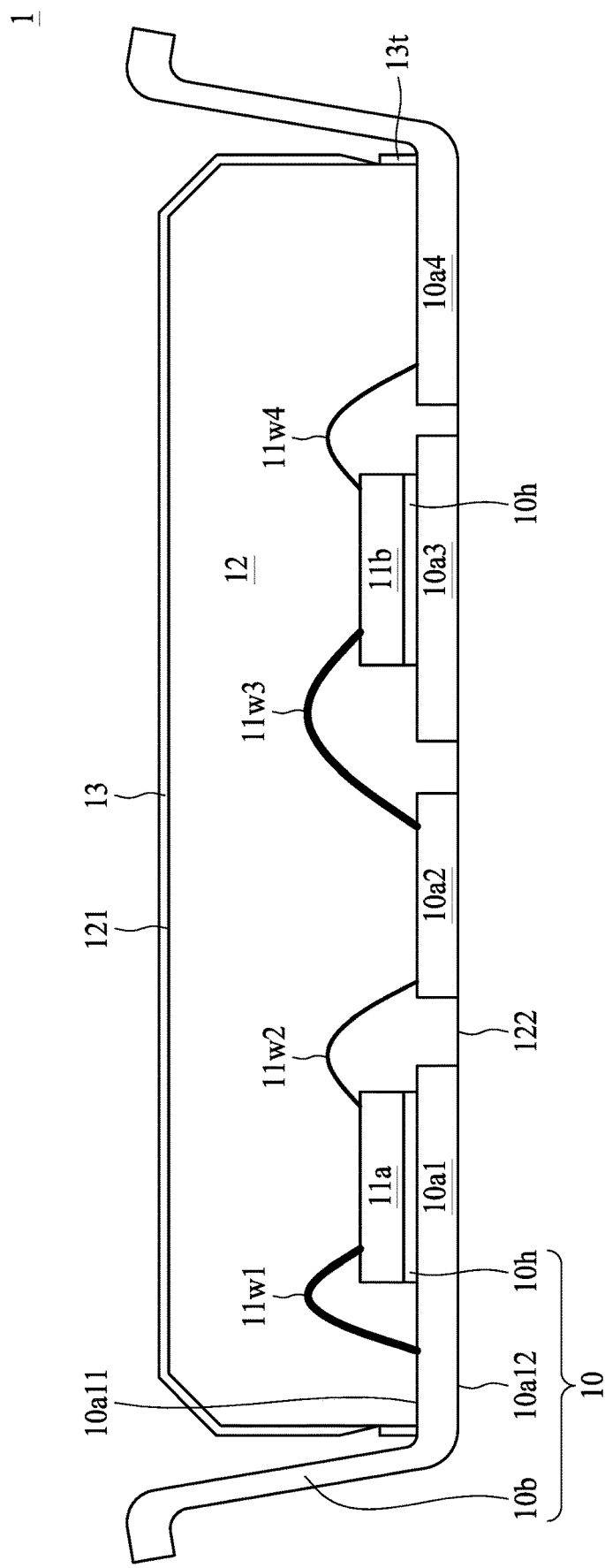
FIG. 1 illustrates a cross-sectional view of a semiconductor package device in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1 illustrates a cross-sectional view of a semiconductor package device 1 in accordance with some embodiments of the present disclosure. The semiconductor package device 1 includes a leadframe 10, electronic components 11a, 11b, a package body 12 and a metal lid 13.

In some embodiments, the leadframe 10 is a pre-molded leadframe including die pads (or die paddles) 10a1, 10a2, 10a3 and 10a4 and leads 10b. In some embodiments, the die pads 10a1, 10a2, 10a3 and 10a4 are physically separated from each other. In some embodiments, the leadframe 10 is, or includes, copper or a copper alloy. In some embodiments, tin may be plated on the leadframe 10. In other embodiments, the leadframe 10 includes one of, or a combination of, iron, an iron alloy, nickel, a nickel alloy, or another metal or metal alloy. In some embodiments, the leadframe 10 is coated with a silver or copper layer. Each die pad 10a1 has a top surface (or first surface) 10a11 and a bottom surface (or second surface) 10a12 opposite to the top surface 10a11. The lead 10b extends upwardly from the bottom surface 10a12 of the die pad 10a1. For example, the lead 10b may extend from a bottom surface 122 of the package body 12 toward a top surface 121 of the package body 12.

The electronic component 11a is disposed on the top surface 10a11 of the die pad 10a1 of the leadframe 10. In some embodiments, the electronic component 11a is attached to the die pad 10a1 of the leadframe 10 through an adhesive 10h (e.g., a solder, a plating film or a metal film). The electronic component 11a may include a chip or a die including a semiconductor substrate, one or more integrated circuit devices and/or one or more overlying interconnection structures therein. The integrated circuit devices may include active devices such as transistors and/or passive devices such resistors, capacitors, inductors, or a combination thereof. In some embodiments, the electronic component 11a includes a power MOSFET, an IGBT and/or a junction gate field-effect transistor (JFET). In some embodiments, the electronic component 11a is electrically connected to the die pad 10a1 through a conductive wire 11w1 and electrically connected to the die pad 10a2 through a conductive wire 11w2. In some embodiments, a thickness of the conductive wire 11w1 is different from a thickness of the conductive wire 11w2. For example, the thickness of the conductive wire 11w1 is about 20 mils while the thickness of the conductive wire 11w2 is about 3 mils. In some embodiments, the conductive wires 11w1 and 11w2 include aluminum.

The electronic component 11b is disposed on the die pad 10a3 of the leadframe 10. In some embodiments, the electronic component 11b is attached to the die pad 10a3 of the leadframe 10 through an adhesive 10h. The electronic component 11b may include a chip or a die including a semiconductor substrate, one or more integrated circuit devices and/or one or more overlying interconnection structures therein. The integrated circuit devices may include active devices such as transistors and/or passive devices such resistors, capacitors, inductors, or a combination thereof. In some embodiments, the electronic component 11b includes a power MOSFET, an IGBT and/or a JFET. In some embodiments, the electronic component 11b is electrically connected to the die pad 10a2 through a conductive wire 11w3 and electrically connected to the die pad 10a4 through a conductive wire 11w4. In some embodiments, a thickness of the conductive wire 11w3 is different from a thickness of the conductive wire 11w4. For example, the thickness of the conductive wire 11w3 is about 20 mils while the thickness of the conductive wire 11w4 is about 3 mils. In some embodiments, the conductive wires 11w3 and 11w4 include aluminum.

The package body 12 is disposed on the die pads 10a1, 10a2, 10a3 and 10a4 to cover or encapsulate the electronic components 11a and 11b. The package body 12 exposes at least a portion of the lead 10b. In some embodiments, the package body 12 includes an epoxy resin including fillers, a molding compound (e.g., an epoxy molding compound or other molding compound), a polyimide, a phenolic compound or material, a material with a silicone dispersed therein, or a combination thereof. The package body 12 has the top surface 121 (or first surface) and the bottom surface 122 (or second surface) opposite to the top surface 121. The top surface 121 of the package body 12 is lower than a top portion of the lead 10b of the leadframe 10 (e.g. the lead 10b extends to a position higher than the top surface 121 of the package body 12). For example, a length of the lead 10b of the leadframe 10 is greater than a thickness of the package body 12. In some embodiments, the bottom surface 122 of the package body 12 is substantially coplanar with the bottom surface 10a12 of the die pad 10a1 of the leadframe 10.

The metal lid 13 is disposed on the top surface 121 of the package body 12 and on at least a portion of a lateral surface of the package body 12. The metal lid 13 is spaced apart from the die pad 10a1 through an insulation material (e.g., a tape) 13t. In some embodiments, the metal lid 13 includes a conductive thin film or a metal layer, and may include, for example, aluminum, copper, chromium, tin, gold, silver, nickel or stainless steel, or a mixture, an alloy, or other combination thereof. The metal lid 13 can provide electromagnetic interference (EMI) shielding for the electronic components 11a and 11b. In addition, the metal lid 13 can provide for heat dissipation for the electronic components 11a and 11b, which can increase a power efficiency of the semiconductor package device 1.

Figure 2:
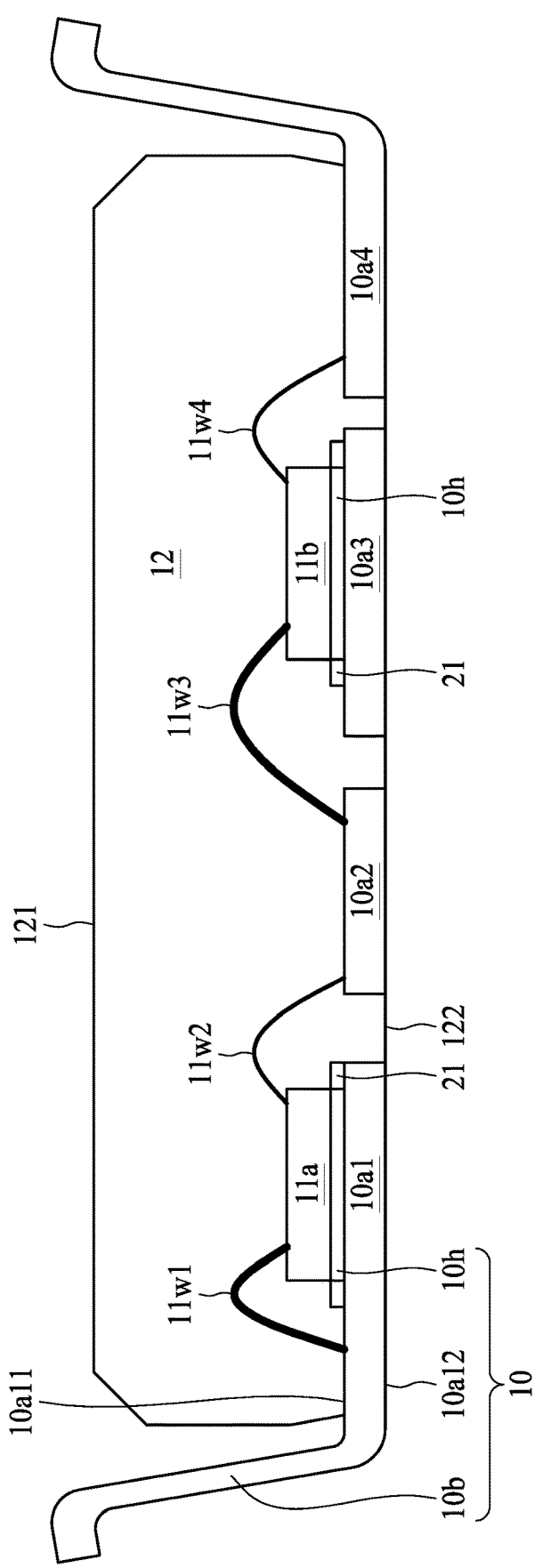
FIG. 2 illustrates a cross-sectional view of a semiconductor package device in accordance with some embodiments of the present disclosure.

FIG. 2 illustrates a cross-sectional view of a semiconductor package device 2 in accordance with some embodiments of the present disclosure. The semiconductor package device 2 is similar to the semiconductor package device 1 shown in FIG. 1 except that the semiconductor package device 2 does not include the metal lid 13 or the insulation material 13t, and the semiconductor package device 2 further includes an oxidation layer 21. In some embodiments, the semiconductor package device 2 may include both the metal lid 13 and the oxidation layer 21.

The oxidation layer 21 is disposed on the die pads 10a1 and 10a3 of the leadframe 10 and surrounds the adhesive 10h. The oxidation layer 21 can prevent the adhesive 10h from spreading on the electronic component 11a or 11b, which can help to facilitate control of a coverage of the adhesive 10h.

Figure 3:
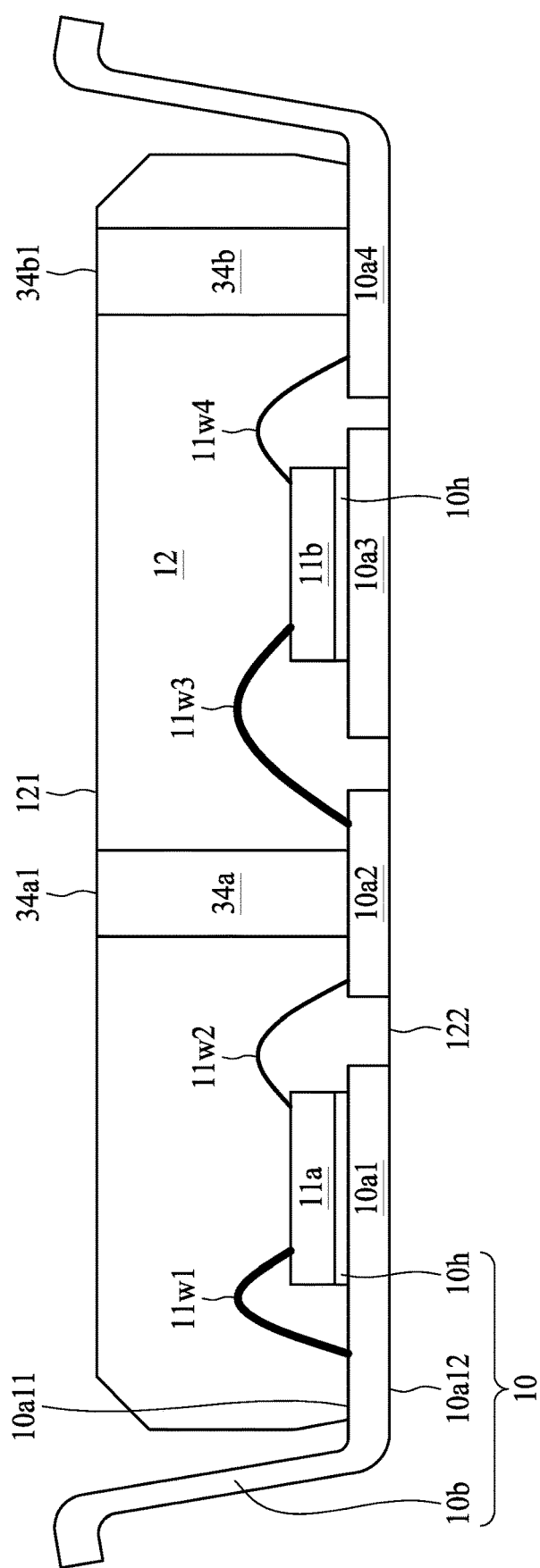
FIG. 3 illustrates a cross-sectional view of a semiconductor package device in accordance with some embodiments of the present disclosure.

FIG. 3 illustrates a cross-sectional view of a semiconductor package device 3 in accordance with some embodiments of the present disclosure. The semiconductor package device 3 is similar to the semiconductor package device 1 shown in FIG. 1 except that the semiconductor package device 3 does not include the metal lid 13 or the insulation material 13t, and the semiconductor package device 3 further includes conductive posts 34a and 34b.

The conductive post 34a is disposed on the die pad 10a2 of the leadframe 10 and penetrates the package body 12. For example, the package body 12 covers or encapsulates lateral surfaces of the conductive post 34a and exposes at least a portion of a top surface 34a1 of the conductive post 34a. The conductive post 34b is disposed on the die pad 10a4 of the leadframe 10 and penetrates the package body 12. For example, the package body 12 covers or encapsulates lateral surfaces of the conductive post 34b and exposes at least a portion of a top surface 34b1 of the conductive post 34b. In some embodiments, the conductive posts 34a and 34b include copper or other metals, metal alloys, or other suitable materials. The conductive posts 34a and 34b can provide for heat dissipation for the electronic components 11a and 11b, which can increase a power efficiency of the semiconductor package device 3.

Figure 4:
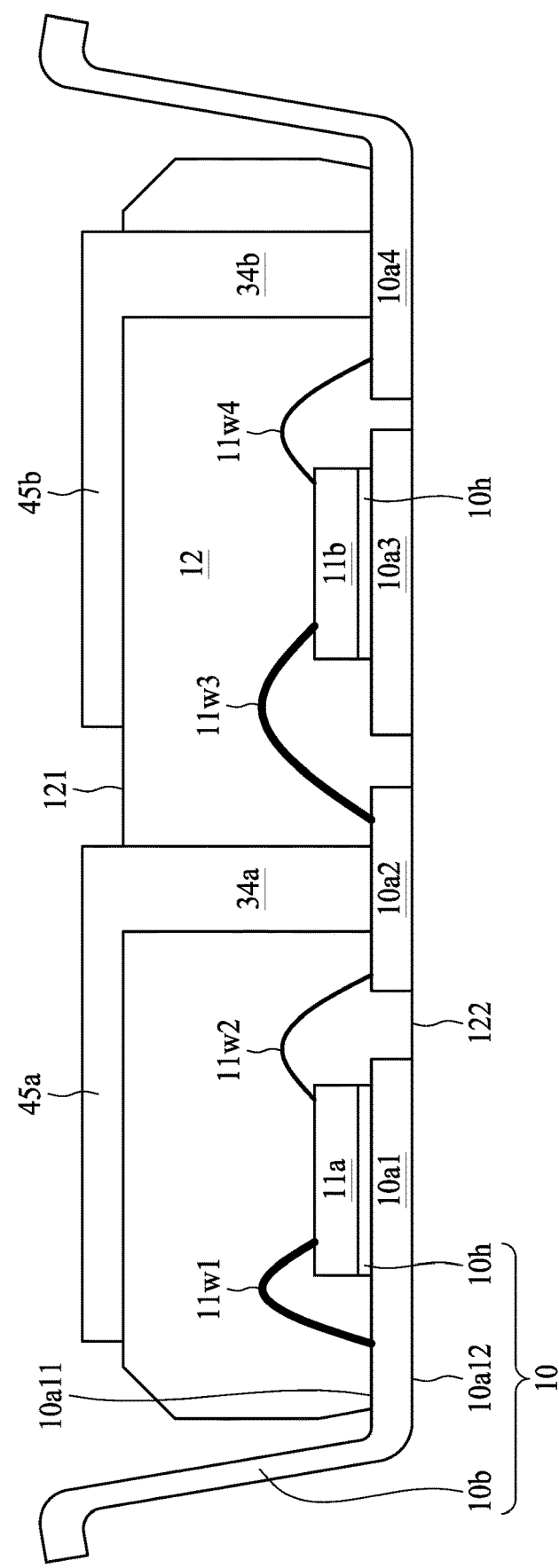
FIG. 4 illustrates a cross-sectional view of a semiconductor package device in accordance with some embodiments of the present disclosure.

FIG. 4 illustrates a cross-sectional view of a semiconductor package device 4 in accordance with some embodiments of the present disclosure. The semiconductor package device 4 is similar to the semiconductor package device 3 shown in FIG. 3 except that the semiconductor package device 4 further includes metal plates 45a and 45b.

The metal plate 45a (which may function as a heat spreader) is disposed on the top surface 121 of the package body 12 and contacts the top surface 34a1 of the conductive post 34*a* that is exposed from the package body 12. The metal plate 45*b* (which may function as a heat spreader) is disposed on the top surface 121 of the package body 12 and contacts the top surface 34*b*1 of the conductive post 34*b* that is exposed from the package body 12. The metal plates 45*a* and 45*b* are separated from each other. The conductive posts 34*a*, 34*b* and metal plates 45*a* and 45*b* can provide for better heat dissipation for the electronic components 11*a* and 11*b* as compared with the semiconductor package device 3 shown in FIG. 3, in some implementations. In some embodiments, the metal plates 45*a* and 45*b* are positioned lower than the top portion of the lead 10*b* of the leadframe 10 (e.g. the lead 10*b* extends to a position higher than a top surface of the metal plate 45*a* and/or a top surface of the metal plate 45*b*). For example, a length of the lead 10*b* of the leadframe 10 is greater than a sum of a thickness of the package body 12 and a thickness of at least one of the metal plates 45*a*, 45*b*.

Figure 5:
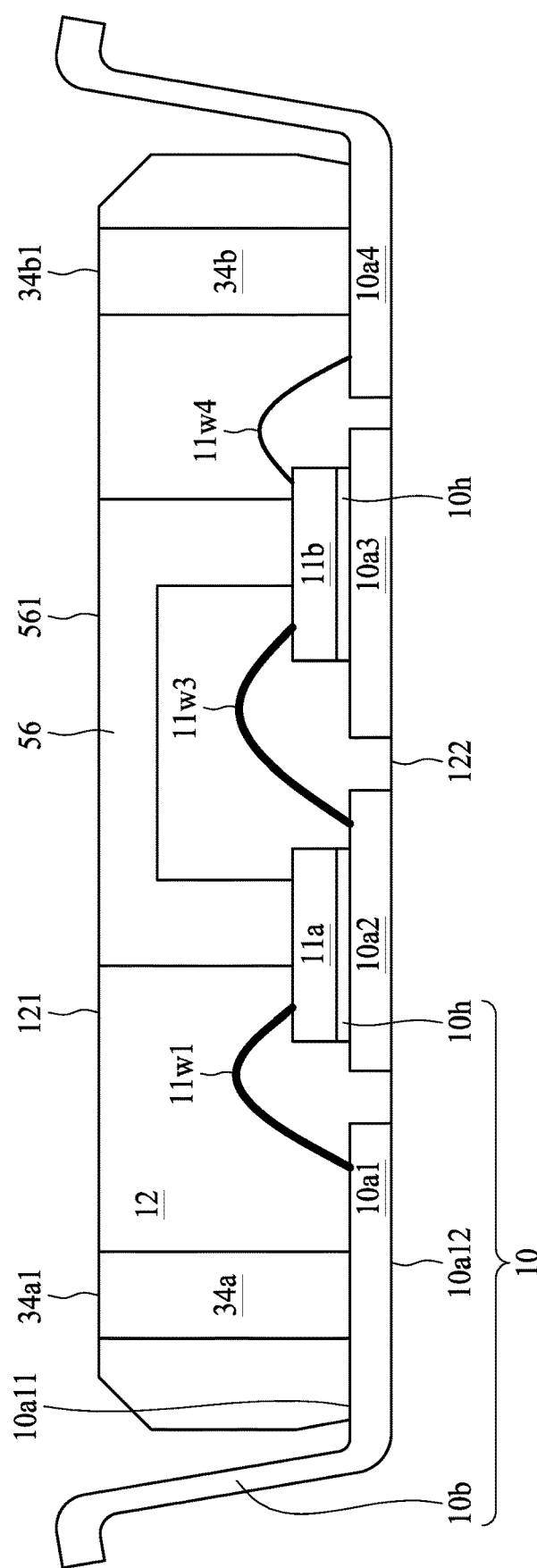
FIG. 5 illustrates a cross-sectional view of a semiconductor package device in accordance with some embodiments of the present disclosure.

FIG. 5 illustrates a cross-sectional view of a semiconductor package device 5 in accordance with some embodiments of the present disclosure. The semiconductor package device 5 is similar to the semiconductor package device 3 shown in FIG. 3 except that in the semiconductor package device 5, the electronic component 11*a* is disposed on the die pad 10*a*2 adjacent to the die pad 10*a*3 on which the electronic component 11*b* is disposed, the conductive wire 11*w*2 is omitted, and the semiconductor package device 5 further includes a metal clip 56.

The metal clip 56 is electrically connected an active surface (or active side) of the electronic component 11*a* and to an active surface of the electronic component 11*b* (thus electrically connecting the two active sides). The metal clip 56 is covered or encapsulated by the package body 12, at least in part. A top portion 561 of the metal clip 56 is exposed from the package body 12. In some embodiments, the metal clip 56 is a metal frame. Connecting the active surfaces of the electronic components 11*a* and 11*b* by a metal clip can help to enhance a heat dissipation for the electronic components 11*a* and 11*b*, which can increase a power efficiency of the semiconductor package device 5.

Figure 6:
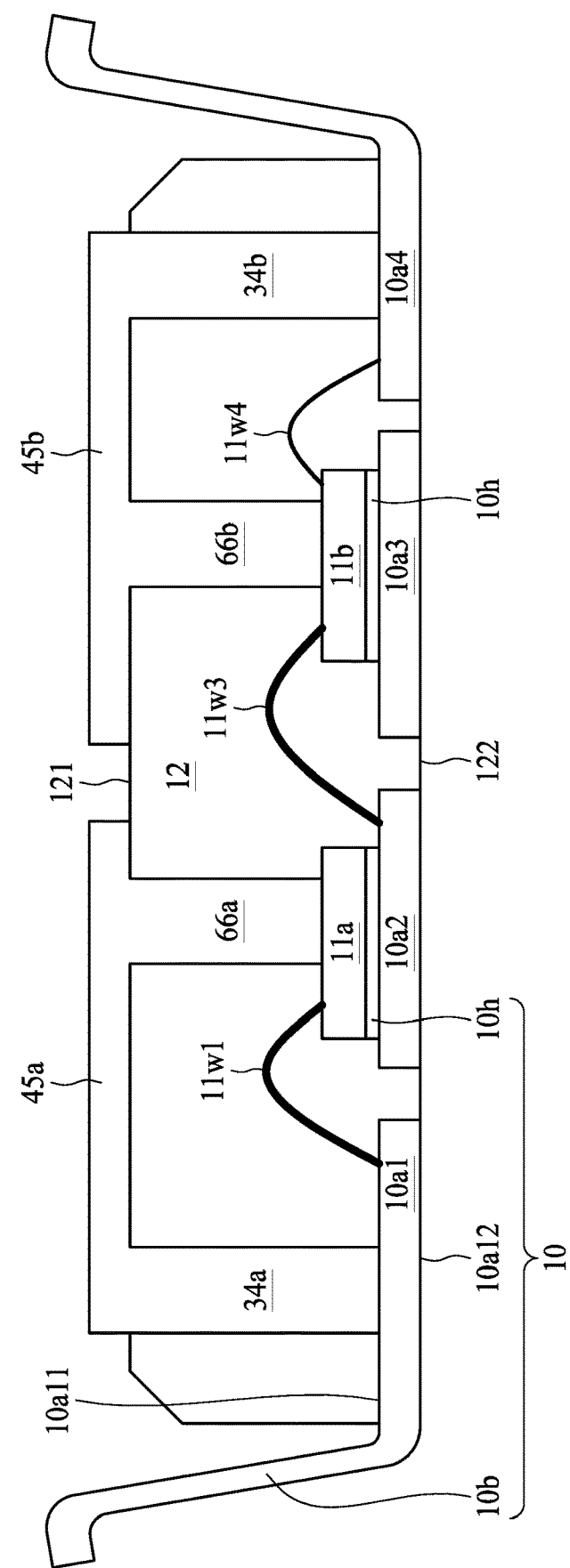
FIG. 6 illustrates a cross-sectional view of a semiconductor package device in accordance with some embodiments of the present disclosure.

FIG. 6 illustrates a cross-sectional view of a semiconductor package device 6 in accordance with some embodiments of the present disclosure. The semiconductor package device 6 is similar to the semiconductor package device 4 shown in FIG. 4 except that in the semiconductor package device 6, the electronic component 11*a* is disposed on the die pad 10*a*2 adjacent to the die pad 10*a*3 on which the electronic component 11*b* is disposed, the conductive wire 11*w*2 is omitted, and the semiconductor package device 6 further includes conductive posts 66*a* and 66*b*.

The conductive post 66*a* is disposed on the active surface of the electronic component 11*a* and electrically connects the electronic component 11*a* to the metal plate 45*a*. The conductive post 66*b* is disposed on the active surface of the electronic component 11*b* and electrically connects the electronic component 11*b* to the metal plate 45*b*. In some embodiments, the conductive posts 66*a* and 66*b* include copper or other metals, metal alloys, or other suitable materials. The conductive posts 66*a* and 66*b* can enhance heat dissipation for the electronic components 11*a* and 11*b*, which can help to increase a power efficiency of the semiconductor package device 6.

Figure 7:
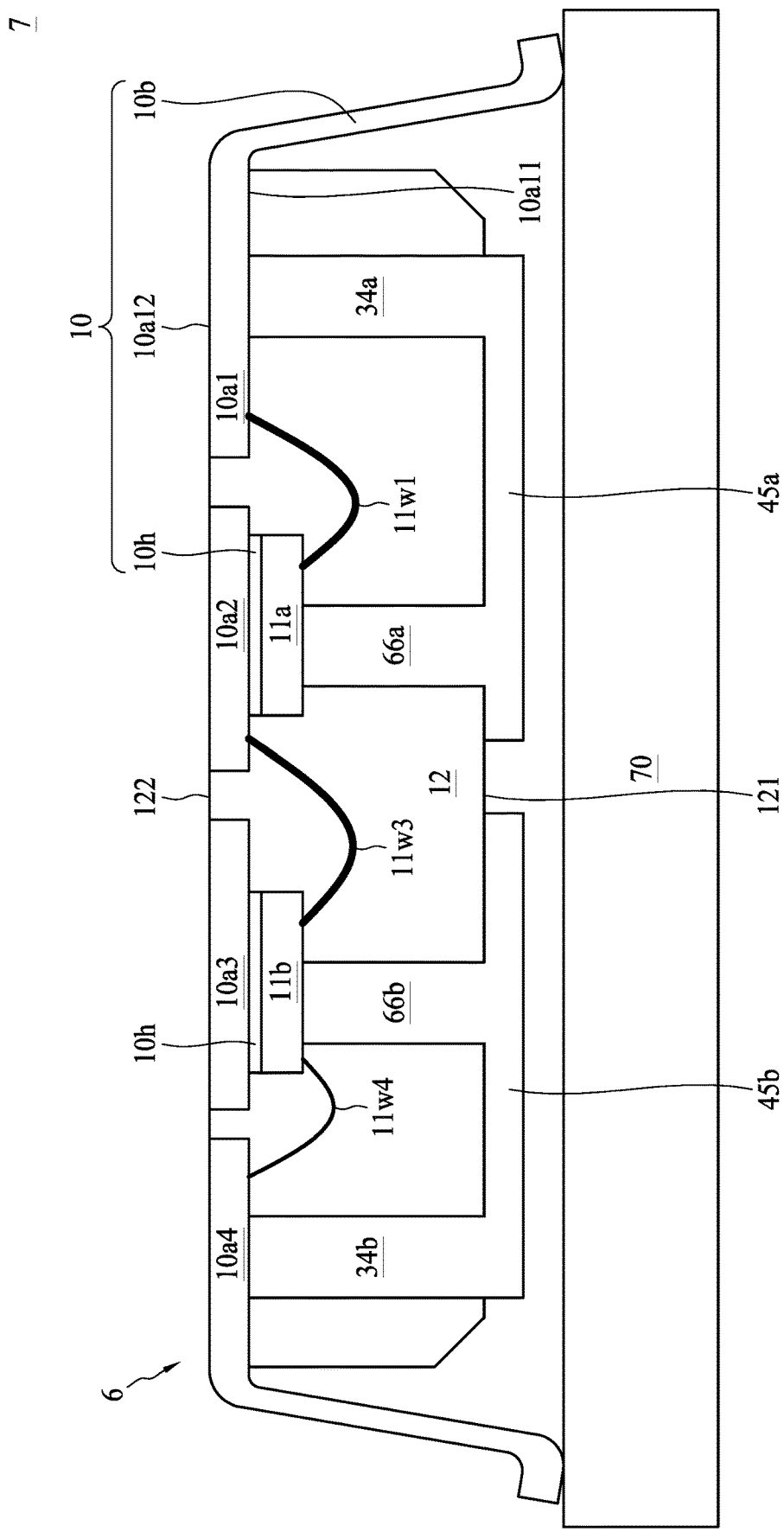
FIG. 7 illustrates a cross-sectional view of a power module in accordance with some embodiments of the present disclosure.

FIG. 7 illustrates a cross-sectional view of a power module 7 in accordance with some embodiments of the present disclosure. The power module 7 includes a substrate (or carrier) 70 and the semiconductor package device 6 as shown in FIG. 6.

The substrate 70 may include, for example, a printed circuit board, such as a paper-based copper foil laminate, a composite copper foil laminate, or a polymer-impregnated glass-fiber-based copper foil laminate. The substrate 70 may include an interconnection structure, such as a redistribution layer (RDL) or a grounding element. The semiconductor package device 6 shown in FIG. 6 is inverted from the orientation shown in FIG. 6 and disposed on the substrate 70. For example, the leads 10*b* of the leadframe 10 are electrically connected to the substrate 70. The package body 12 of the semiconductor package device 6 is spaced apart from the substrate 70. In some embodiments, the power module 7 can be implemented with any of the semiconductor package devices shown in FIG. 1 through FIG. 5 in place of, or in addition to, the semiconductor package device 6.

Figure 8A:
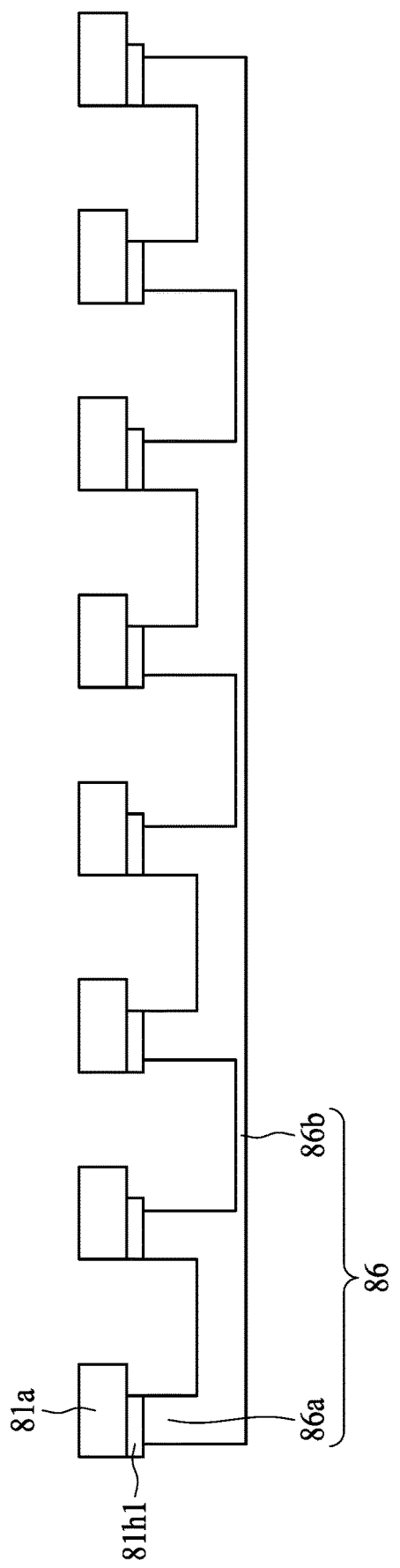
FIG. 8A, FIG. 8B and FIG. 8C illustrate a manufacturing process in accordance with some embodiments of the present disclosure.
Figure 8B:
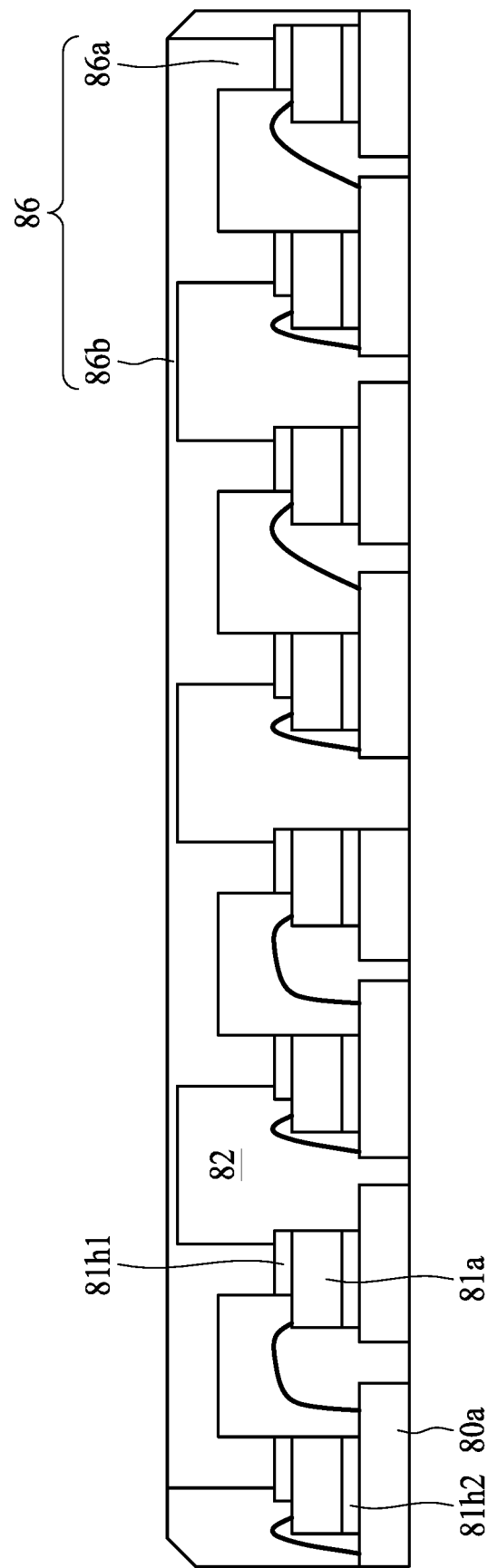
Figure 8C:
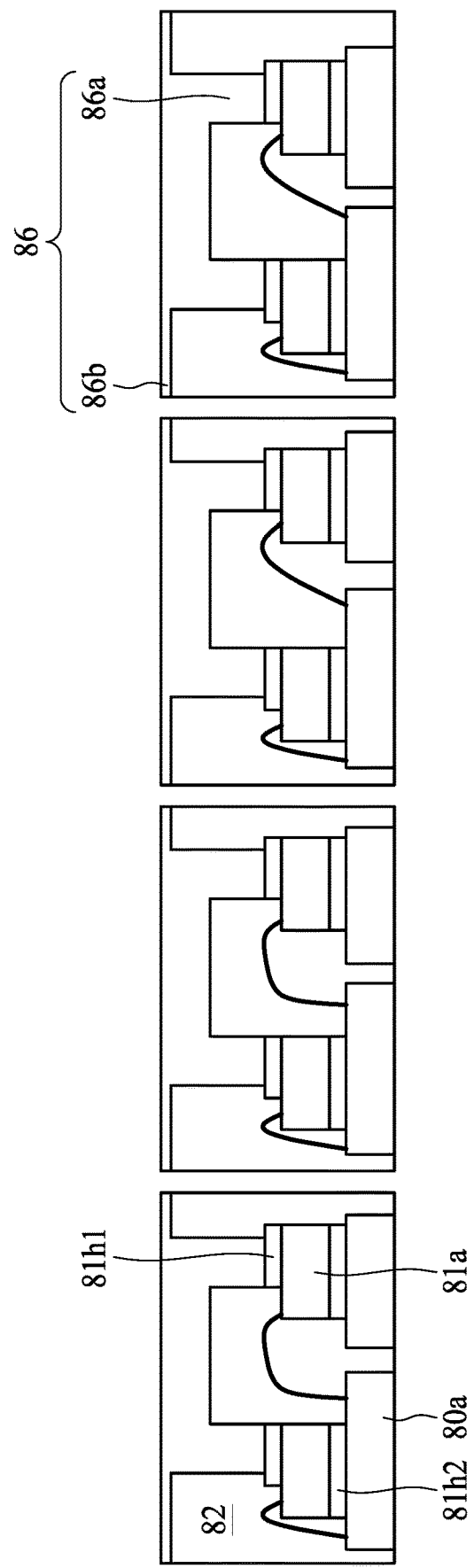

FIG. 8A, FIG. 8B and FIG. 8C illustrate a manufacturing process in accordance with some embodiments of the present disclosure.

Referring to FIG. 8A, a metal frame 86 (or conductive clip strip) is provided. The metal frame 86 includes a plurality of contact portions 86*a* electrically connected to each other through a connection portion 86*b*.

A plurality of dies or chips 81*a* are attached to the contact portions 86*a* of the metal frame 86 through an adhesive 81*h*1. In some embodiments, the adhesive 81*h*1 includes solder, plating film or metal film. In some embodiments, an active surface (or first surface) of each of the dies 81*a* is attached to the contact portion 86*a* of the metal frame 86.

Referring to FIG. 8B, the structure shown in FIG. 8A is inverted and attached to a leadframe. The leadframe includes a plurality of die pads 80*a* separated from each other. In some embodiments, a back surface (or second surface) of each of the dies 81*a* is attached to the corresponding die pad 80*a* of the leadframe through an adhesive 81*h*2. Each of the dies 81*a* is electrically connected to the die pads 80*a* through, for example, a wire bonding technique.

A package body 82 is formed to cover the metal frame 86, the leadframe and the dies 81*a*. In some embodiments, the package body 82 includes an epoxy resin including fillers dispersed therein. The package body 82 may be formed by a molding technique, such as transfer molding or compression molding.

Referring to FIG. 8C, a singulation process may be performed to separate out individual semiconductor package devices. That is, the singulation process is performed through the package body 82 and the connection portion 86*b* of the metal frame 86. The singulation may be performed, for example, by using a dicing saw, laser or other appropriate cutting technique.

In some embodiments, the metal clip 56 connecting the electronic components 11*a* and 11*b* or the metal plate 45*a* connecting the conductive posts 34*a* and 66*a* can be formed by the operations shown in FIG. 8A through FIG. 8C, which can provide for an efficient manufacturing process with a low manufacturing cost.

As used herein, the terms "substantially," "substantial," "approximately," and "about" are used to denote small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" or "substantially aligned" can refer to two surfaces within micrometers (μm) of lying along the same plane, such as within 100 μm, within 80 μm, within 60

μm, within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation. The term "substantially flat" can refer to a surface roughness (Ra) of about 3 μm to about 20 μm, where a difference between a highest point and a lowest point of the surface is about 5 μm to about 10 μm. As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
    a leadframe including a first pad, a second pad, a third pad, a fourth pad, and a lead extending from the first pad, wherein the first pad, the second pad, the third pad, and the fourth pad are physically separated from each other from a cross sectional perspective, and a bottom surface of the first pad, a bottom surface of the second pad, a bottom surface of the third pad, and a bottom surface of the fourth pad are substantially coplanar;
    a package body covering the first pad, the package body having a top surface, a bottom surface opposite to the top surface and a first outermost lateral surface extending from the top surface to the bottom surface;
    a first electronic component disposed over the first pad;
    a conductive material disposed on the first pad, the first electronic component electrically connecting to the lead through the conductive material and the first pad, wherein the lead is extended along the first outermost lateral surface to the top surface from a first surface of the first pad; and
    a metal layer on the first outermost lateral surface of the package body, wherein the metal layer is spaced apart from the first pad through an insulation material disposed on the first outermost lateral surface of the package body, and an edge of the metal layer and an edge of the insulation material define a recess on the first outermost lateral surface of the package body.

2. The semiconductor package device of claim 1, wherein the first electronic component is electrically connected to the second pad by a first conductive wire, the semiconductor package device further comprises a second electronic component electrically connected to the second pad by a second conductive wire, and the first conductive wire and the second conductive wire have different thicknesses and both directly contact the second pad.

3. The semiconductor package device of claim 2, wherein the third pad is bonded to the second electronic component, the fourth pad is electrically connected to the second electronic component by a third conductive wire, the second conductive wire is located in a region between the first conductive wire and the third conductive wire, and a thickness of the second conductive wire is greater than a thickness of the first conductive wire and a thickness of the third conductive wire.

4. The semiconductor package device of claim 1, wherein the bottom surface of the first pad, the bottom surface of the second pad, the bottom surface of the third pad, and the bottom surface of the fourth pad are exposed from and substantially coplanar with the bottom surface of the package body.

5. The semiconductor package device of claim 1, further comprising an oxidation layer disposed adjacent to the conductive material and configured to prevent the conductive material from spreading on the first electronic component.

6. The semiconductor package device of claim 5, wherein the oxidation layer has a lateral surface aligned with a lateral surface of the first electronic component.

7. The semiconductor package device of claim 5, wherein the oxidation layer surrounds the conductive material.

8. A power module, comprising:
    a leadframe including a pad and a lead extending from the pad;
    an electronic component disposed on the pad;
    a package body covering the pad, the package body having a topmost surface, a bottommost surface opposite to the topmost surface, and an outside extended between the topmost surface and the bottommost surface; and
    a metal layer disposed on the outside of the package body and configured to provide electromagnetic interference (EMI) shielding for the electronic component, wherein a thickness of the metal layer decreases towards the bottommost surface of the package body,
    wherein the lead is extended along the outside of the package body from the bottommost surface to the topmost surface, and the lead is tilted toward away from the topmost surface of the package body, and wherein the metal layer is spaced apart from the pad through an insulation material disposed on the outside of the package body, and an edge of the metal layer and an edge of the insulation material define a recess on the outside of the package body.

9. The power module of claim 8, wherein the thickness of the metal layer decreases towards the insulation material.

10. The power module of claim 8, wherein the insulation material is spaced apart from the lead.

11. The power module of claim 8, wherein the insulation material directly contacts the pad.

12. A semiconductor package device comprising:
a leadframe including a first pad, a second pad, a third pad, a fourth pad, and a lead extending from the first pad, wherein the first pad, the second pad, the third pad, and the fourth pad are physically separated from each other from a cross sectional perspective, and a bottom surface of the first pad, a bottom surface of the second pad, a bottom surface of the third pad, and a bottom surface of the fourth pad are substantially coplanar;
a package body covering the first pad, the package body having a top surface, a bottom surface opposite to the top surface and a first outermost lateral surface extending from the top surface to the bottom surface;
a first electronic component disposed over the first pad;
a conductive material disposed on the first pad, the first electronic component electrically connecting to the lead through the conductive material and the first pad, wherein the lead is extended along the first outermost lateral surface to the top surface from a first surface of the first pad;
the first electronic component is electrically connected to the second pad by a first conductive wire, the semiconductor package device further comprises a second electronic component electrically connected to the second pad by a second conductive wire, and the first conductive wire and the second conductive wire have different thicknesses and both directly contact the second pad;
a conductive post disposed on the second pad of the leadframe and penetrating the package body, wherein a top surface of the conductive post is substantially coplanar with the top surface of the package body;
a heat spreader disposed on the top surface the package body and in contact with the top surface of the conductive post; and
the first electronic component is under the heat spreader.

13. The semiconductor package device of claim 12, wherein side surfaces of the heat spreader are exposed from the package body.

14. The semiconductor package device of claim 12, wherein the conductive post is located at a region between the first conductive wire and the second conductive wire.

* * * * *